US009373477B2

(12) United States Patent
Liu et al.

(10) Patent No.: US 9,373,477 B2
(45) Date of Patent: *Jun. 21, 2016

(54) ELECTRON EMISSION DEVICE AND ELECTRON EMISSION DISPLAY

(71) Applicants: Tsinghua University, Beijing (CN); HON HAI PRECISION INDUSTRY CO., LTD., New Taipei (TW)

(72) Inventors: Peng Liu, Beijing (CN); De-Jie Li, Beijing (CN); Chun-Hai Zhang, Beijing (CN); Duan-Liang Zhou, Beijing (CN); Bing-Chu Du, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/599,989

(22) Filed: Jan. 19, 2015

(65) Prior Publication Data

US 2015/0206699 A1 Jul. 23, 2015

(30) Foreign Application Priority Data

Jan. 20, 2014 (CN) .......................... 2014 1 0024369

(51) Int. Cl.

| | |
|---|---|
| ***H01L 29/06*** | (2006.01) |
| ***H01J 31/12*** | (2006.01) |
| ***H01J 29/02*** | (2006.01) |
| ***H01J 29/18*** | (2006.01) |

(52) U.S. Cl.

CPC ................. *H01J 31/12* (2013.01); *H01J 29/02* (2013.01); *H01J 29/18* (2013.01)

(58) Field of Classification Search

CPC ........... H01J 1/308; H01J 1/304; H01J 1/312; H01J 31/127; H01J 31/12

USPC ............................................................ 257/10

See application file for complete search history.

(56) References Cited

U.S. PATENT DOCUMENTS

| | | | | |
|---|---|---|---|---|
| 8,846,437 | B2 | 9/2014 | Singh et al. | |
| 9,136,117 | B2 | 9/2015 | Li et al. | |
| 2003/0036332 | A1* | 2/2003 | Talin | B82Y 10/00 445/24 |
| 2004/0085010 | A1* | 5/2004 | Takeuchi | G09G 3/22 313/310 |
| 2005/0116214 | A1* | 6/2005 | Mammana | B82Y 10/00 257/10 |
| 2005/0145835 | A1* | 7/2005 | Yoo | B82Y 10/00 257/10 |
| 2006/0138933 | A1* | 6/2006 | Yoo | H01J 29/085 313/495 |
| 2006/0186786 | A1* | 8/2006 | Iwamatsu | G03G 15/0291 313/495 |
| 2006/0291905 | A1* | 12/2006 | Hirakawa | G03G 15/02 399/168 |
| 2007/0018552 | A1* | 1/2007 | Cho | H01J 63/06 313/311 |
| 2008/0211401 | A1* | 9/2008 | Nakada | B82Y 10/00 313/509 |

(Continued)

FOREIGN PATENT DOCUMENTS

| | | |
|---|---|---|
| CN | 100530744 | 8/2009 |
| TW | 201222863 | 6/2012 |

(Continued)

*Primary Examiner* — Douglas Menz

(74) *Attorney, Agent, or Firm* — ScienBiziP, P.C.

(57) ABSTRACT

An electron emission device includes a number of electron emission units spaced from each other, wherein each of the number of electron emission units includes a first electrode, a semiconductor layer, an insulating layer, and a second electrode stacked with each other, the first electrode includes a carbon nanotube layer, a number of holes defines in the semiconductor layer, and a portion of the carbon nanotube layer suspended on the number of holes.

19 Claims, 15 Drawing Sheets

(56) References Cited

U.S. PATENT DOCUMENTS

| | | | | | |
|---|---|---|---|---|---|
| 2008/0248310 | A1* | 10/2008 | Kim | B82Y 30/00 | 428/408 |
| 2010/0039014 | A1* | 2/2010 | Kim | H01J 3/023 | 313/103 R |
| 2010/0215402 | A1* | 8/2010 | Nagaoka | B82Y 10/00 | 399/168 |
| 2011/0169276 | A1* | 7/2011 | Akamatsu | H02N 11/008 | 290/1 R |
| 2011/0221328 | A1* | 9/2011 | Nemanich | H01J 1/14 | 313/355 |
| 2011/0254431 | A1* | 10/2011 | Hirakawa | B82Y 10/00 | 313/326 |
| 2012/0074874 | A1* | 3/2012 | Hirata | B82Y 10/00 | 315/326 |
| 2015/0206689 | A1* | 7/2015 | Liu | H01J 1/308 | 257/10 |
| 2015/0206691 | A1* | 7/2015 | Liu | H01J 29/18 | 257/10 |
| 2015/0206692 | A1* | 7/2015 | Liu | H01J 1/308 | 257/10 |
| 2015/0206693 | A1* | 7/2015 | Liu | H01J 29/04 | 257/10 |
| 2015/0206694 | A1* | 7/2015 | Liu | H01J 29/04 | 257/10 |
| 2015/0206695 | A1* | 7/2015 | Liu | H01J 29/04 | 257/10 |
| 2015/0206696 | A1* | 7/2015 | Liu | H01J 29/04 | 257/10 |
| 2015/0206697 | A1* | 7/2015 | Liu | H01J 29/04 | 257/10 |

FOREIGN PATENT DOCUMENTS

| | | |
|---|---|---|
| TW | 518632 | 1/2013 |
| TW | 201314986 | 4/2013 |
| TW | 201339087 | 10/2013 |

* cited by examiner

ELECTRON EMISSION DEVICE AND ELECTRON EMISSION DISPLAY

CROSS-REFERENCE TO RELATED APPLICATIONS

This application claims all benefits accruing under 35 U.S.C. §119 from China Patent Application 201410024369.6, filed on Jan. 20, 2014 in the China Intellectual Property Office, disclosure of which is incorporated herein by reference.

BACKGROUND

1. Technical Field

The present disclosure relates to an electron emission device and electron emission display with the electron emission device, especially a cold cathode electron emission device with carbon nanotubes and the electron emission display with the same.

2. Description of Related Art

Electron emission display device is an integral part of the various vacuum electronics devices and equipment. In the field of display technology, electron emission display device can be widely used in automobiles, home audio-visual appliances, industrial equipment, and other fields.

Typically, the electron emission source in the electron emission display device has two types: hot cathode electron emission source and the cold cathode electron emission source. The cold cathode electron emission source comprises surface conduction electron-emitting source, field electron emission source, metal-insulator-metal (MIM) electron emission sources, and metal-insulator-semiconductor-metal (MISM) electron emission source, etc.

In MISM electron emission source, the electrons need to have sufficient electron average kinetic energy to escape through the upper electrode to a vacuum. However, in traditional MISM electron emission source, since the barrier is often higher than the average kinetic energy of electrons, the electron emission in the electron emission device is low, and the display effect of the electron emission display is not satisfied.

What is needed, therefore, is to provide an electron emission device and electron emission display that can overcome the above-described shortcomings.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
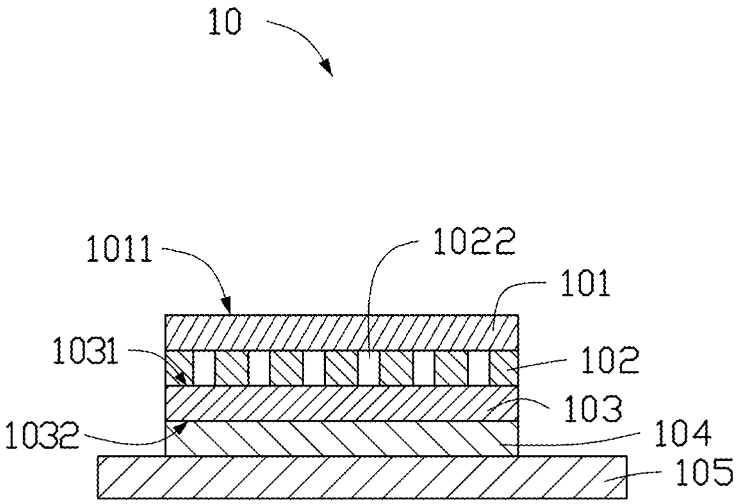
FIG. 1 shows a schematic view of one embodiment of an electron emission device.

Referring to FIG. 1, an electron emission source 10 of one embodiment comprises a first electrode 101, a semiconductor layer 102, an insulating layer 103, and a second electrode 104 stacked in that sequence. The first electrode 101 is spaced from the second electrode 104. A surface of the first electrode 101 is an electron emission surface to emit electron.

The insulating layer 103 has a first surface 1031 and second surface 1032 opposites to the first surface 1031. The second electrode 104 is located on the second surface 1032 of the insulating layer 103. Furthermore, the second electrode 104 can cover entire the second surface 1032 of the insulating layer 103. A material of the insulating layer 103 can be a hard material such as aluminum oxide, silicon nitride, silicon oxide, or tantalum oxide. The material of the insulating layer 103 can also be a flexible material such as benzocyclobutene (BCB), acrylic resin, or polyester. A thickness of the insulating layer 103 can range from about 50 nanometers to 100 micrometers. In one embodiment, the insulating layer 103 is tantalum oxide with a thickness of 100 nanometers.

The semiconductor layer 102 is located on the first surface 1031 of the insulating layer 103. In one embodiment, the semiconductor layer 102 covers entire the first surface 1031 of the insulating layer 103. The semiconductor layer 102 is insulated from the second electrode 104 by the insulating layer 103. The semiconductor layer 102 plays a role of accelerating electrons. The electrons are accelerated in the semiconductor layer 102. A material of the semiconductor layer 102 can be a semiconductor material, such as zinc sulfide, zinc oxide, magnesium zinc oxide, magnesium sulfide, cadmium sulfide, cadmium selenide, or zinc selenide. A thickness of the semiconductor layer 102 can range from about 3 nanometers to about 100 nanometers. In one embodiment, the material of the semiconductor layer 102 is zinc sulfide having a thickness of 50 nanometers.

The semiconductor layer 102 is a continuous and patterned structure. The semiconductor layer 102 defines a plurality of holes 1022 spaced from each other. A duty cycle of the plurality of holes 1022 can range from 1:10 to 1:1, such as 1:3, 1:5, or 1:8. A cross-sectional shape of each of the plurality of holes 122 can be circular, rectangular, triangular, or other geometric shapes. The distance between adjacent two of the plurality of holes 1022 range from about 5 nanometers to about 1 micrometer.

Furthermore, although the semiconductor layer 102 defines the plurality of holes 1022, the plurality of holes 1022 does not disrupt the overall structure of the semiconductor layer 102, and the semiconductor layer 102 remains continuous state. The plurality of holes 1022 can reduce the stress between the first electrode 101 and the semiconductor layer 102, thereby the possibility of damaging the first electrode 101 and the semiconductor layer 102 can be reduced. A diameter of the hole 1022 can range from about 5 nanometer to about 50 nanometer. In one embodiment, the diameter of the hole 1022 is 20 nanometers.

Each of the plurality of holes 1022 can be blind hole or through hole. While the plurality of holes 1022 are blind holes, the blind holes can uniformly distribute on the surface of the semiconductor layer 102 adjacent to the first electrode 101. Thus the surface of the semiconductor layer 102 near the first electrode 101 is a patterned surface.

Furthermore, the blind holes can also be distributed on both two surfaces of the semiconductor layer 102. A depth of the blind hole can be selected depending on the thickness of the semiconductor layer 102, and the depth of the blind hole is smaller than the thickness of the semiconductor layer 102. While the plurality of holes 1022 are through holes, the through holes penetrate through the semiconductor layer 102 along the thickness direction of the semiconductor layer 102. The through holes can be uniformly distributed in the semiconductor layer 102 to uniformly disperse the stress between the first electrode 101 and the semiconductor layer 102. In one embodiment, the plurality of holes 1022 are through holes.

Furthermore, the semiconductor layer 102 can also be a discontinuous structure. In one embodiment, the semiconductor layer 102 is a patterned semiconductor layer. The semiconductor layer 102 is divided into a plurality of blocks spaced apart from each other by the plurality of holes 1022. The gaps between adjacent blocks are defined as the plurality of holes 102. The distance of the gaps can be selected according to the thickness of the first electrode 101 to ensure that the first electrode 101 can be suspended on the plurality of holes 1022 without damage to the first electrode 101.

The first electrode 101 is located on a surface of the semiconductor layer 102 away from the insulating layer 103. The first electrode 101 can also play a role of emitting electron. The first electrode 101 comprises a carbon nanotube layer. In one embodiment, the first electrode 101 is a carbon nanotube layer. The carbon nanotube layer comprises a plurality of carbon nanotubes. The plurality of carbon nanotubes has a small work function, thus the electrons can have sufficient speed and energy. Thus the electrons can easily escape from the surface of the first electrode 101. The first electrode 101 can cover the entire surface of the semiconductor layer 102 away from dielectric layer 103 to uniformly disperse the current.

In detail, the first electrode 101 comprises a first surface and second surface opposite the first surface. The second surface is in contact with the semiconductor layer 102. The first surface is the electron emitting surface, and the electrons are emitted from the first surface. The first electrode 101 is suspended on the plurality of holes 1022, and a portion of the first electrode 101 on the plurality of holes is spaced apart from inner sidewall of the plurality of holes 1022.

The carbon nanotubes in the first electrode 101 extend parallel to the surface of the first electrode 101. The carbon nanotubes corresponding to the hole 1022 are not in contact with the sidewalls plurality of hole 1022.

The carbon nanotube layer includes a plurality of carbon nanotubes. The carbon nanotubes in the carbon nanotube layer can be single-walled, double-walled, or multi-walled carbon nanotubes. The length and diameter of the carbon nanotubes can be selected according to need. The thickness of the carbon nanotube layer can be in a range from about 10 nm to about 100 μm, for example, about 10 nm, 100 nm, 200 nm, 1 μm, 10 μm or 50 μm.

The carbon nanotube layer forms a pattern so one part of the semiconductor layer 102 can be exposed from the patterned carbon nanotube layer. The patterned carbon nanotube layer defines a plurality of apertures. Thus the electrons can be easily emitted from the semiconductor layer 102. The apertures can be dispersed uniformly. The apertures extend throughout the carbon nanotube layer along the thickness direction thereof. The aperture can be a hole defined by several adjacent carbon nanotubes, or a gap defined by two substantially parallel carbon nanotubes and extending along axial direction of the carbon nanotubes. The size of the aperture can be the diameter of the hole or width of the gap, and the average aperture size can be in a range from about 10 nm to about 500 μm, for example, about 50 nm, 100 nm, 500 nm, 1 μm, 10 μm, 80 μm or 120 μm. The hole-shaped apertures and the gap-shaped apertures can exist in the patterned carbon nanotube layer at the same time. The sizes of the apertures within the same carbon nanotube layer can be different. The smaller the size of the apertures, the less dislocation defects will occur during the process of growing first semiconductor layer 120. In one embodiment, the sizes of the apertures are in a range from about 10 nm to about 10 μm.

The carbon nanotubes of the carbon nanotube layer can be orderly arranged to form an ordered carbon nanotube structure or disorderly arranged to form a disordered carbon nanotube structure. The term 'disordered carbon nanotube structure' includes, but is not limited to, a structure where the carbon nanotubes are arranged along many different directions, and the aligning directions of the carbon nanotubes are random. The number of the carbon nanotubes arranged along each different direction can be substantially the same (e.g. uniformly disordered). The disordered carbon nanotube structure can be isotropic. The carbon nanotubes in the disordered carbon nanotube structure can be entangled with each other. The term 'ordered carbon nanotube structure' includes, but is not limited to, a structure where the carbon nanotubes are arranged in a consistently systematic manner, e.g., the carbon nanotubes are arranged approximately along a same direction and/or have two or more sections within each of which the carbon nanotubes are arranged approximately along a same direction (different sections can have different directions).

In one embodiment, the carbon nanotubes in the carbon nanotube layer are arranged to extend along the direction substantially parallel to the surface of the semiconductor layer 102. In one embodiment, all the carbon nanotubes in the carbon nanotube layer are arranged to extend along the same direction. In another embodiment, some of the carbon nanotubes in the carbon nanotube layer are arranged to extend along a first direction, and some of the carbon nanotubes in the carbon nanotube layer are arranged to extend along a second direction, perpendicular to the first direction.

In one embodiment, the carbon nanotube layer is a free-standing structure and can be drawn from a carbon nanotube array. The term "free-standing structure" means that the carbon nanotube layer can sustain the weight of itself when it is hoisted by a portion thereof without any significant damage to its structural integrity. Thus, the carbon nanotube layer can be suspended by two spaced supports. The free-standing carbon nanotube layer can be laid on the semiconductor layer 102 directly and easily.

The carbon nanotube layer can be a substantially pure structure of the carbon nanotubes, with few impurities and chemical functional groups. The carbon nanotube layer can be a composite including a carbon nanotube matrix and non-carbon nanotube materials. The non-carbon nanotube materials can be graphite, graphene, silicon carbide, boron nitride, silicon nitride, silicon dioxide, diamond, amorphous carbon, metal carbides, metal oxides, or metal nitrides. The non-carbon nanotube materials can be coated on the carbon nanotubes of the carbon nanotube layer or filled in the apertures. In one embodiment, the non-carbon nanotube materials are coated on the carbon nanotubes of the carbon nanotube layer so the carbon nanotubes can have a greater diameter and the apertures can a have smaller size. The non-carbon nanotube materials can be deposited on the carbon nanotubes of the carbon nanotube layer by CVD or physical vapor deposition (PVD), such as sputtering.

The carbon nanotube layer can include at least one carbon nanotube film, at least one carbon nanotube wire, or a combination thereof. In one embodiment, the carbon nanotube layer can include a single carbon nanotube film or two or more stacked carbon nanotube films. Thus, the thickness of the carbon nanotube layer can be controlled by the number of the stacked carbon nanotube films. The number of the stacked carbon nanotube films can be in a range from about 2 to about 100, for example, about 10, 30, or 50. In one embodiment, the carbon nanotube layer can include a layer of parallel and spaced carbon nanotube wires. The carbon nanotube layer can also include a plurality of carbon nanotube wires crossed or weaved together to form a carbon nanotube net. The distance between two adjacent parallel and spaced carbon nanotube wires can be in a range from about 0.1 μm to about 200 μm. In one embodiment, the distance between two adjacent parallel and spaced carbon nanotube wires can be in a range from about 10 μm to about 100 μm. The size of the apertures can be controlled by controlling the distance between two adjacent parallel and spaced carbon nanotube wires. The length of the gap between two adjacent parallel carbon nanotube wires can be equal to the length of the carbon nanotube wire. It is understood that any carbon nanotube structure described can be used with all embodiments.

Figure 2:
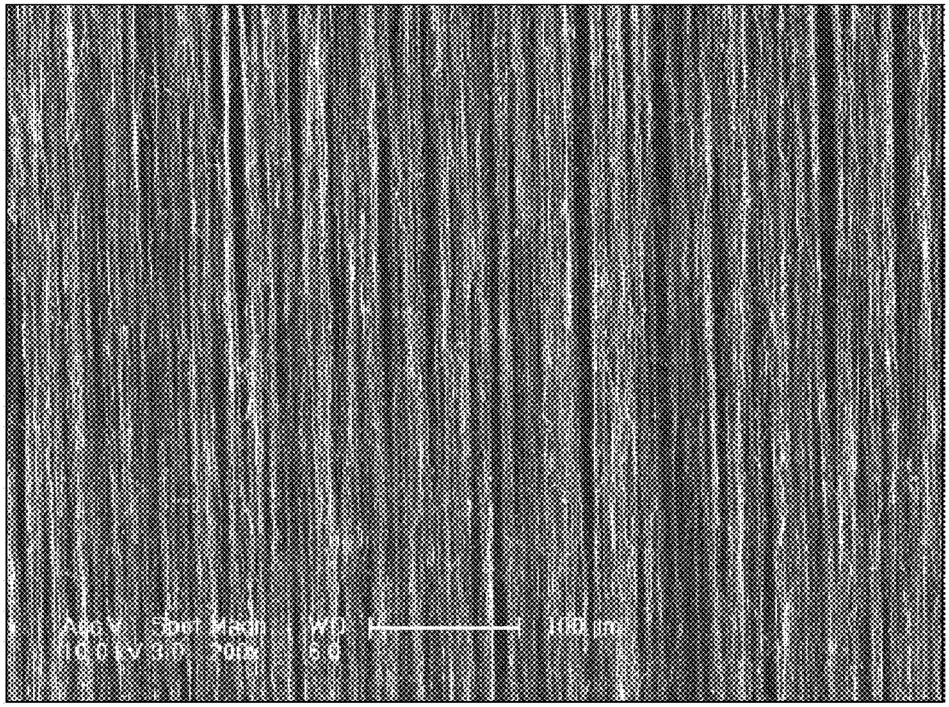
FIG. 2 shows a Scanning Electron Microscope (SEM) image of carbon nanotube film.

In one embodiment, the carbon nanotube layer includes at least one drawn carbon nanotube film. A drawn carbon nanotube film can be drawn from a carbon nanotube array that is able to have a film drawn therefrom. The drawn carbon nanotube film includes a plurality of successive and oriented carbon nanotubes joined end-to-end by van der Waals attractive force therebetween. The drawn carbon nanotube film is a free-standing film. Referring to FIG. 2, each drawn carbon nanotube film includes a plurality of successively oriented carbon nanotube segments joined end-to-end by van der Waals attractive force therebetween. Each carbon nanotube segment includes a plurality of carbon nanotubes parallel to each other, and combined by van der Waals attractive force therebetween. Some variations can occur in the drawn carbon nanotube film. The carbon nanotubes in the drawn carbon nanotube film are oriented along a preferred orientation. The drawn carbon nanotube film can be treated with an organic solvent to increase the mechanical strength and toughness, and reduce the coefficient of friction of the drawn carbon nanotube film. A thickness of the drawn carbon nanotube film can range from about 0.5 nm to about 100 μm.

Figure 3:
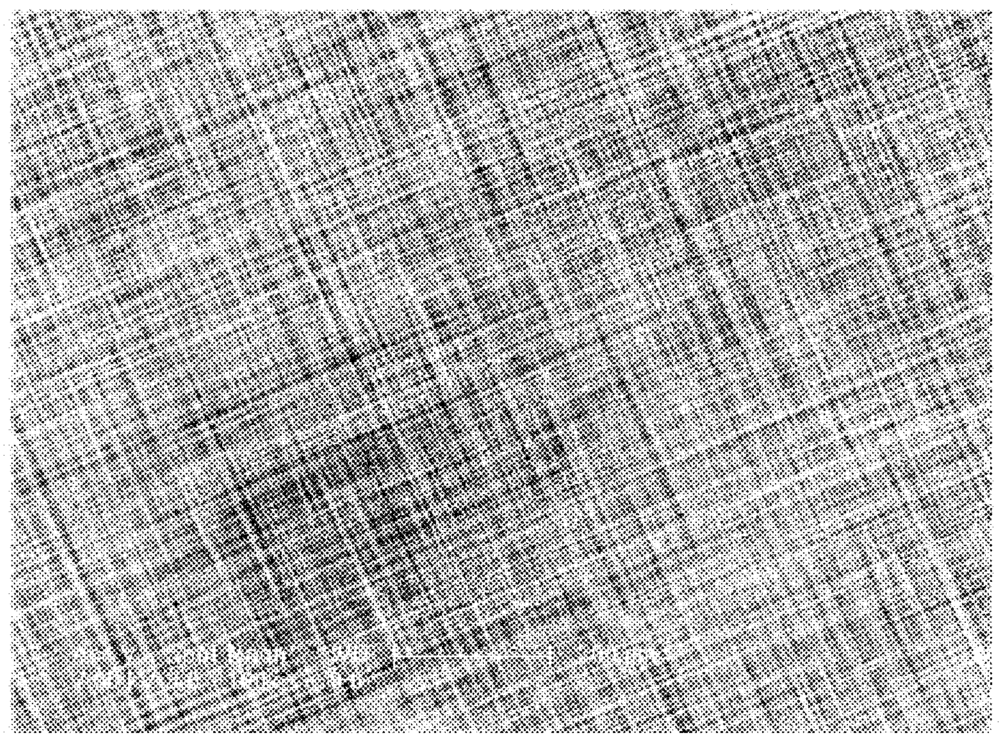
FIG. 3 shows a SEM image of a stacked carbon nanotube film structure.

Referring to FIG. 3, the carbon nanotube layer can include at least two stacked drawn carbon nanotube films. In other embodiments, the carbon nanotube layer can include two or more coplanar carbon nanotube films, and each coplanar carbon nanotube film can include multiple layers. Additionally, if the carbon nanotubes in the carbon nanotube film are aligned along one preferred orientation (e.g., the drawn carbon nanotube film), an angle can exist between the orientation of carbon nanotubes in adjacent films, whether stacked or adjacent. Adjacent carbon nanotube films are combined by the van der Waals attractive force therebetween. An angle between the aligned directions of the carbon nanotubes in two adjacent carbon nanotube films can range from about 0 degrees to about 90 degrees. If the angle between the aligned directions of the carbon nanotubes in adjacent stacked drawn carbon nanotube films is larger than 0 degrees, a plurality of micropores is defined by the carbon nanotube layer. In one embodiment, the carbon nanotube layer shown with the angle between the aligned directions of the carbon nanotubes in adjacent stacked drawn carbon nanotube films is 90 degrees. Stacking the carbon nanotube films will also add to the structural integrity of the carbon nanotube layer.

Figure 4:
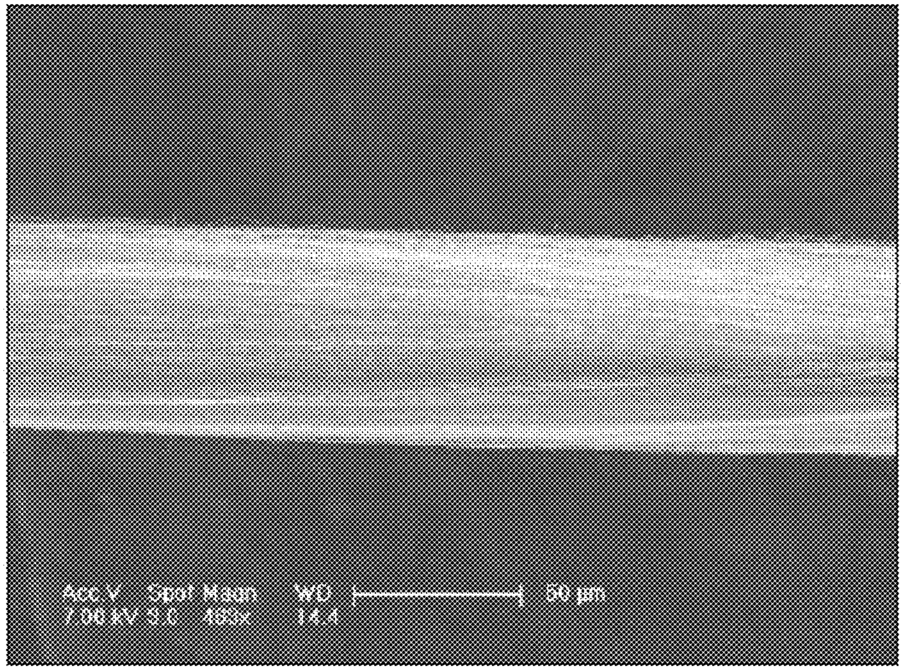
FIG. 4 shows a SEM image of untwisted carbon nanotube wire.

The carbon nanotube wire can be untwisted or twisted. Treating the drawn carbon nanotube film with a volatile organic solvent can form the untwisted carbon nanotube wire. Specifically, the organic solvent is applied to soak the entire surface of the drawn carbon nanotube film. During the soaking, adjacent parallel carbon nanotubes in the drawn carbon nanotube film will bundle together, due to the surface tension of the organic solvent as it volatilizes. Thus, the drawn carbon nanotube film will be shrunk into untwisted carbon nanotube wire. Referring to FIG. 4, the untwisted carbon nanotube wire includes a plurality of carbon nanotubes substantially oriented along a same direction (i.e., a direction along the length of the untwisted carbon nanotube wire). The carbon nanotubes are parallel to the axis of the untwisted carbon nanotube wire. Specifically, the untwisted carbon nanotube wire includes a plurality of successive carbon nanotube segments joined end to end by van der Waals attractive force therebetween. Each carbon nanotube segment includes a plurality of carbon nanotubes substantially parallel to each other, and combined by van der Waals attractive force therebetween. The carbon nanotube segments can vary in width, thickness, uniformity, and shape. Length of the untwisted carbon nanotube wire can be arbitrarily set as desired. A diameter of the untwisted carbon nanotube wire ranges from about 0.5 nm to about 100 μm.

Figure 5:
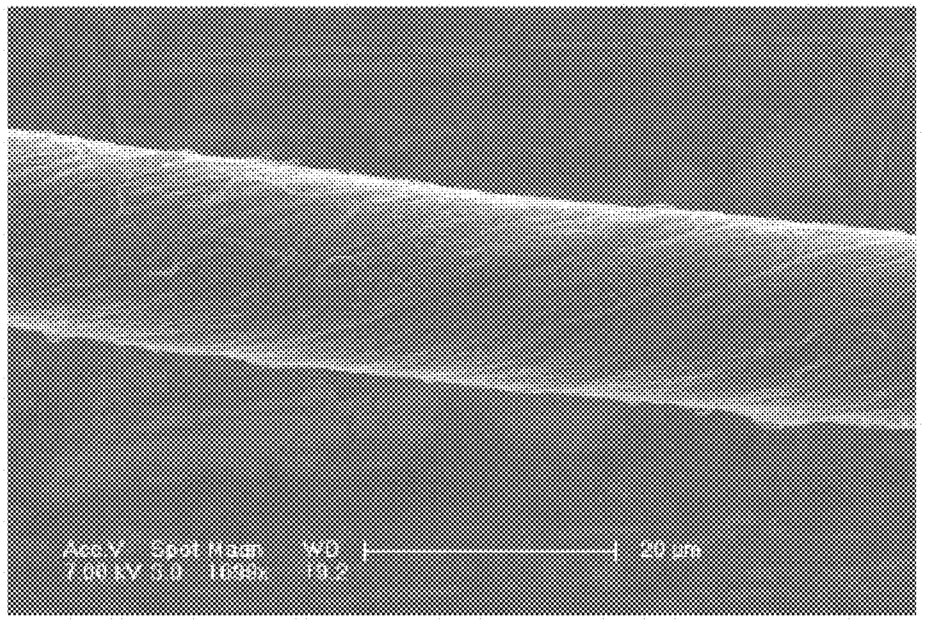
FIG. 5 shows a SEM image of twisted carbon nanotube wire.

The twisted carbon nanotube wire can be formed by twisting a drawn carbon nanotube film using a mechanical force to turn the two ends of the drawn carbon nanotube film in opposite directions. Referring to FIG. 5, the twisted carbon nanotube wire includes a plurality of carbon nanotubes helically oriented around an axial direction of the twisted carbon nanotube wire. Specifically, the twisted carbon nanotube wire includes a plurality of successive carbon nanotube segments joined end to end by van der Waals attractive force therebetween. Each carbon nanotube segment includes a plurality of carbon nanotubes parallel to each other, and combined by van der Waals attractive force therebetween. Length of the carbon nanotube wire can be set as desired. A diameter of the twisted carbon nanotube wire can be from about 0.5 nm to about 100 μm. Further, the twisted carbon nanotube wire can be treated with a volatile organic solvent after being twisted. After being soaked by the organic solvent, the adjacent paralleled carbon nanotubes in the twisted carbon nanotube wire will bundle together, due to the surface tension of the organic solvent when the organic solvent volatilizes. The specific surface area of the twisted carbon nanotube wire will decrease, while the density and strength of the twisted carbon nanotube wire will be increased.

The second electrode 104 is a thin conductive metal film. A material of the second electrode 104 can be gold, platinum, scandium, palladium, or hafnium metal. The thickness of the second electrode 104 can range from about 10 nanometers to about 100 micrometers, such as 10 nanometers, 50 nanometers. In one embodiment, the second electrode 104 is molybdenum film having a thickness of 100 nanometers. Furthermore, the material of the second electrode 104 may also be carbon nanotubes or graphene.

Furthermore, the electron emission source 10 can be disposed on a substrate 105, and the second electrode 104 is applied on a surface of the substrate 105. The substrate 105 supports the electron emission source 10. A material of the substrate 105 can glass, quartz, ceramics, diamond, silicon, or other hard plastic materials. The material of the substrate 105 can also be resins and other flexible materials. In one embodiment, the substrate 105 is silica.

The electron emission source 10 works in the alternating current (AC) driving mode. The working principle of the electron emission source is: in the negative half cycle, the potential of the second electrode 104 is high, and the electrons are injected into the semiconductor layer 102 from the carbon nanotube layer. An interface between the semiconductor layer 102 and insulating layer 103 forms an interface state. In the positive half cycle, due to the higher potential of the carbon nanotube layer of the the first electrode 101, the electrons stored on the interface state are pulled to the semiconductor layer 102 and accelerated in the semiconductor layer 102. Because the semiconductor layer 102 is in contact with the carbon nanotube layer of the the first electrode 101, a part of high-energy electrons can rapidly pass through the carbon nanotube layer of the first electrode 101.

Furthermore, because the semiconductor layer 102 defines the plurality of holes 1022, the electrons can be easily transmitted through the carbon nanotube layer corresponding to the plurality of holes 1022, rather than through the semiconductor layer 102. Thus the electrons have a greater kinetic energy to pass through the carbon nanotube layer. Furthermore, because of the plurality of holes 1022, the semiconductor layer 102 of material can be saved. Finally, the plurality of holes 1022 can further reduce the stress between the semiconductor layer 102 and the carbon nanotube layer. Therefore, the possibility of damaging the carbon nanotube layer and the semiconductor layer 102 can be reduced.

Figure 6:
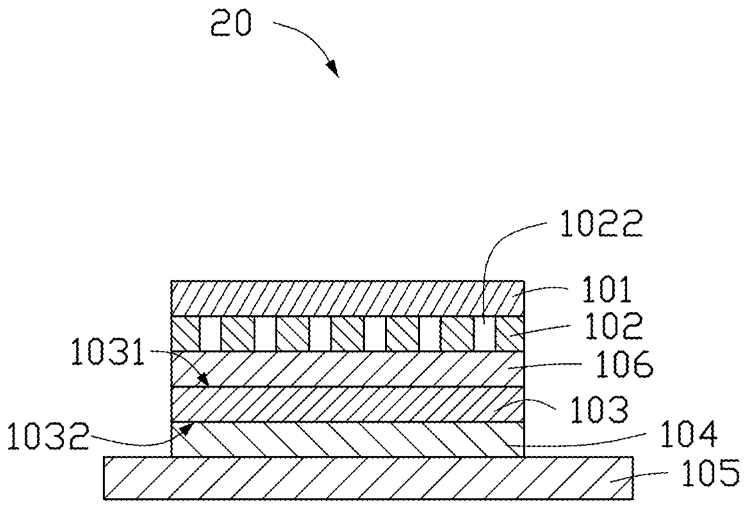
FIG. 6 shows a schematic view of another embodiment of an electron emission device.

Referring to FIG. 6, an electron emission source 20 of one embodiment comprises a first electrode 101, a semiconductor layer 102, a electron collection layer 106, an insulating layer 103, and a second electrode 104 stacked in that sequence.

The structure of the electron emission source 20 is similar to that of the electron emission source 10, except that the electron collection layer 106 is further sandwiched between the semiconductor layer 102 and the insulating layer 103. The electron collection layer 106 is in contact with the semiconductor layer 102 and the insulating layer 103. The electron collection layer 106 is capable of collecting and storing the electrons.

The electron collection layer 106 comprises a first surface and a second surface opposite to the first surface. The first surface is in contact with the semiconductor layer 102, and the second surface is in contact with the insulating layer 103. The electron collection layer 106 is a conductive layer formed of a conductive material. The material of the conductive layer can be gold, platinum, scandium, palladium, hathium, and other metal or metal alloy. Furthermore, the electron collection layer 106 can also be carbon nanotubes or graphene. A thickness of the electron collection layer 106 can range from about 0.1 nanometers to about 10 nanometers.

In one embodiment, the electron collection layer 106 can comprise a carbon nanotube layer. The carbon nanotube layer structure can similar to the first electrode 101.

The electron collection layer 106 can also be a graphene layer. The graphene layer can include at least one graphene film. The graphene film, namely a single-layer graphene, is a single layer of continuous carbon atoms. The single-layer graphene is a nanometer-thick two-dimensional analog of fullerenes and carbon nanotubes. When the graphene layer includes the at least one graphene film, a plurality of graphene films can be stacked on each other or arranged coplanar side by side. The thickness of the graphene layer can be in a range from about 0.34 nanometers to about 10 micrometers. For example, the thickness of the graphene layer can be 1 nanometer, 10 nanometers, 200 nanometers, 1 micrometer, or 10 micrometers. The single-layer graphene can have a thickness of a single carbon atom. In one embodiment, the graphene layer is a pure graphene structure consisting of graphene. Because the single-layer graphene has great conductivity, the electrons can be easily collected and accelerated to the semiconductor layer 102.

The graphene layer can be prepared and transferred to the substrate by graphene powder or graphene film. The graphene film can also be prepared by the method of chemical vapor deposition (CVD) method, a mechanical peeling method, electrostatic deposition method, a silicon carbide (SiC) pyrolysis, or epitaxial growth method. The graphene powder can prepared by liquid phase separation method, intercalation stripping method, cutting carbon nanotubes, preparation solvothermal method, or organic synthesis method.

In one embodiment, the electron collection layer 106 is a drawn carbon nanotube film having a thickness of 5 nanometers to 50 nanometers. The carbon nanotube film has good tensile conductivity and electron collecting effect. Furthermore, the carbon nanotube film has good mechanical properties, which can effectively improve the lifespan of the electron emission source 20.

Figure 7:
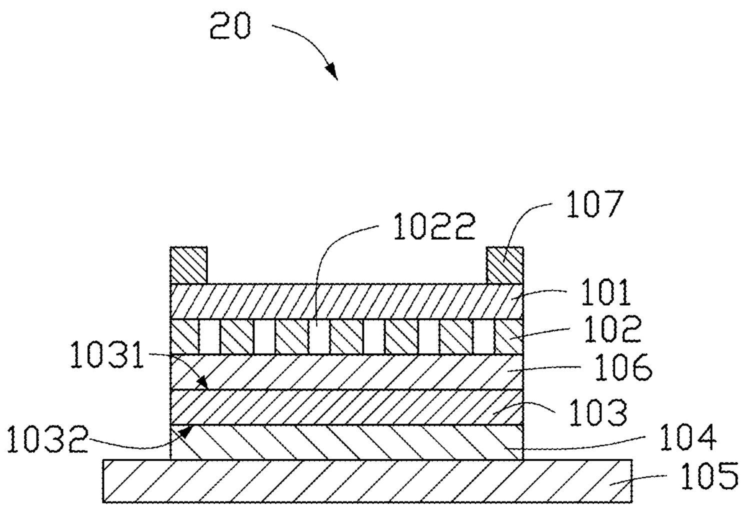
FIG. 7 shows a schematic view of one embodiment of an electron emission device with a bus electrode.

Referring to FIG. 7, a pair of bus electrodes 107 can be applied on the first electrode 101. The pair of bus electrodes 107 are spaced from each other and electrically connected to the first electrode 101 in order to supply current. Each bus electrode 107 is a bar-shaped electrode.

While the first electrode 101 comprises the plurality of carbon nanotubes, the pair of bus electrodes 107 can be applied on the two opposite sides of the first electrode 101 along the extending direction of the carbon nanotubes. The extending direction of the bar-shaped bus electrode 107 is perpendicular to the extending direction of the plurality of carbon nanotubes of the the first electrode 101. Thus the current can be uniformly distributed in the first electrode 101.

A shape of the bus electrode 107 can be bar-shaped, square, triangular, rectangular, etc. A material of the bus electrode 107 can be gold, platinum, scandium, palladium, hathium, or metal alloy. In one embodiment, the bus electrode 107 is bar-shaped platinum electrode. The pair of bar-shaped bus electrodes 107 are parallel with and spaced from each other.

Figure 8:
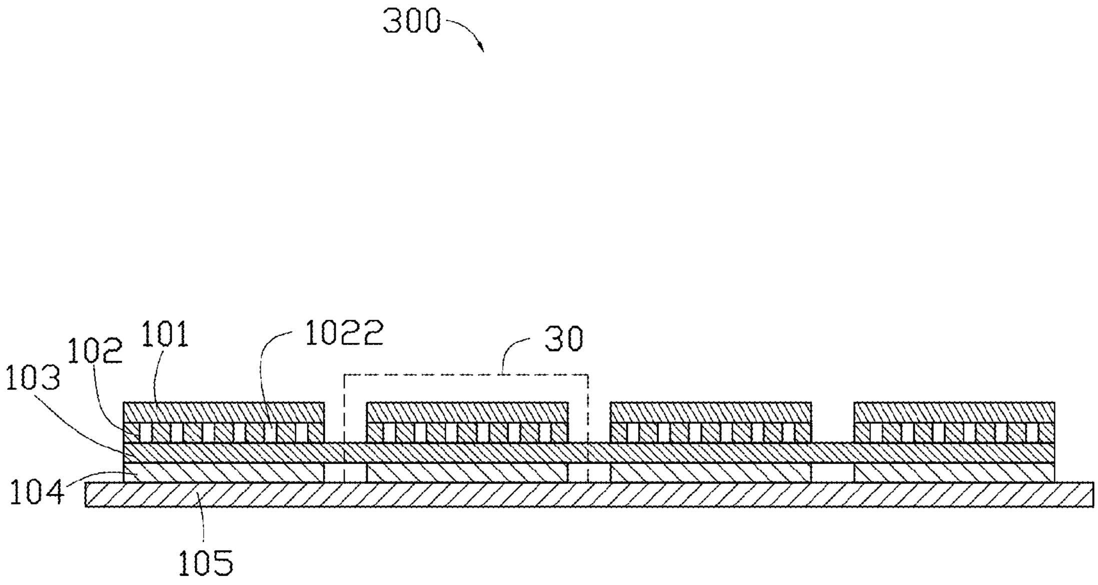
FIG. 8 shows a schematic view of another embodiment of an electron emission device.

Referring to FIG. 8, an electron emission device 300 of one embodiment comprises a plurality of electron emission units 30. Each of the plurality of electron emission units 30 comprises a first electrode 101, a semiconductor layer 102, an insulating layer 103, and a second electrode 104 stacked in that sequence. The insulating layers 103 in the plurality of electron emission units 30 are in contact with each other and form a continuous layer. The electron emission device 300 can be located on a substrate 105.

The electron emission unit 30 is similar to the electron emission source structure 10 described above, except that the plurality of electron emission units 30 share a common insulating layer 103. The plurality of electron emission units 30 can work independently from each other. In detail, the first electrodes 101 in adjacent two electron emission units 30 are spaced apart from each other, the semiconductor layers 102 in adjacent two electron emission units 30 are spaced apart from each other, and the second electrodes 104 in adjacent two electron emission units 30 are also spaced apart from each other.

It can be understood that, the semiconductor layers 102 in the plurality of electron emitting units 30 can be a continuous single layer. Thus the semiconductor layer 102 is a continuous layered structure located on the surface of the insulating layer 103. The first electrodes 101 in the electron emission unit 30 are spaced apart from each other on the insulating layer 103.

Figure 9:
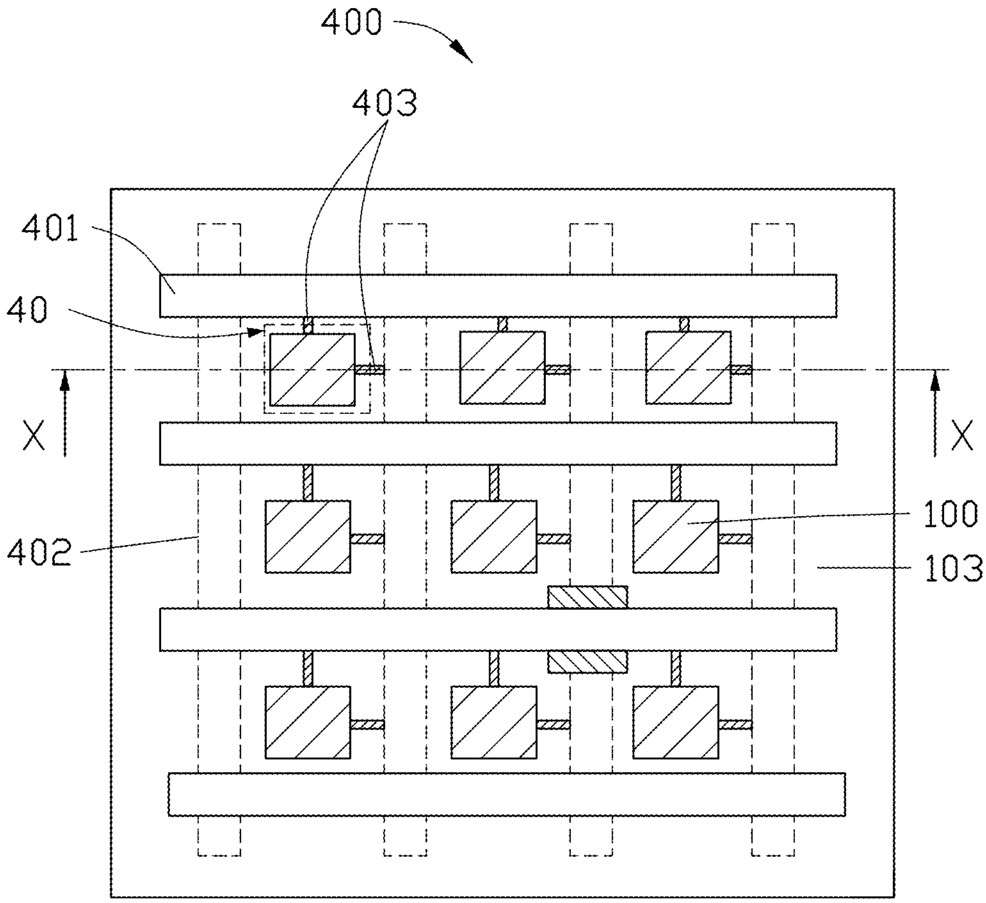
FIG. 9 shows a schematic view of another embodiment of an electron emission device.
Figure 10:
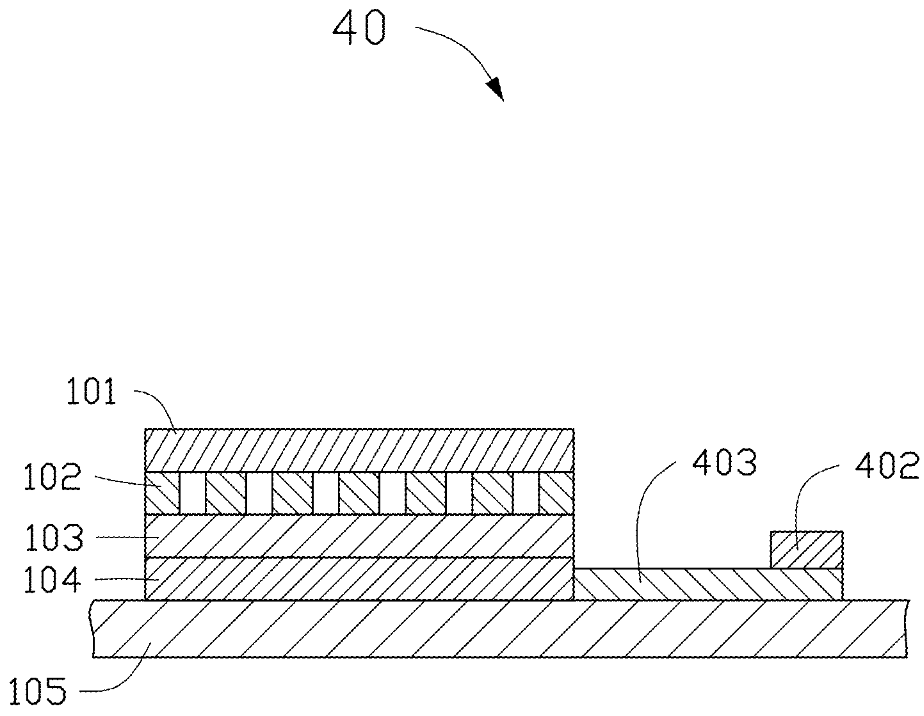
FIG. 10 shows a cross-section view of the electron emission device along a line X-X in FIG. 9.

Referring to FIGS. 9-10, an electron emission device 400 of one embodiment comprises a plurality of electron emission units 40, a plurality of row electrodes 401, and a plurality of column electrodes 402 on a substrate 105. Each of the plurality of electron emission units 40 comprises a first electrode 101, a semiconductor layer 102, an insulating layer 103, and a second electrode 104. The insulating layers 103 in the plurality of electron emission units 40 are connected with each other to form a continuous layered structure.

The electron emission device 400 is similar to the electron emission device 300, except that the electron emission device 400 further comprises the plurality of row electrodes 401 and the plurality of column electrodes 402 electrically connected to the plurality of electron emission units 40.

The plurality of row electrodes 401 is parallel with and spaced from each other. Similarly, the plurality of column electrodes 402 are parallel with and spaced from each other. The plurality of column electrodes 402 are insulated from the plurality of row electrodes 402 through the insulating layer 103. The adjacent two row electrodes 401 are intersected with the adjacent two row electrodes 401 to form a grid.

A section is defined between the adjacent two row electrodes 401 and the adjacent two column electrodes 402. The electron emission unit 40 is received in one of sections and electrically connected to the row electrode 401 and the column electrode 402. The row electrode 401 and the column electrode 402 can electrically connect to the electron emission unit 40 via two electrode leads 403 respectively to supply current for the electron emission unit 40.

In one embodiment, the plurality of column electrodes 402 are perpendicular to the plurality of row electrodes 401.

The plurality of electron emission units 40 form an array with a plurality of rows and columns. The plurality of first electrodes 101 in the plurality of electron emission units 40 are spaced apart from each other. The plurality of second electrodes 104 in the plurality of electron emission units 40 are also spaced apart from each other. The plurality of semiconductor layers 102 in the plurality of electron emission units 40 can be spaced apart from each other.

In one embodiment, the plurality of semiconductor layers 102 in the plurality of electron emission units 40 can connect to each other to form an integrated structure. It means that the plurality of semiconductor layers 102 form a continuous layered structure.

Furthermore, the electron emission unit 40 can be similar to the electron emission source 20. Thus the electron emission unit 40 can further comprises a electron collection layer (not shown) between the semiconductor layer 102 and the insulating layer 103 to collect electrons to improve emission efficiency.

Figure 11:
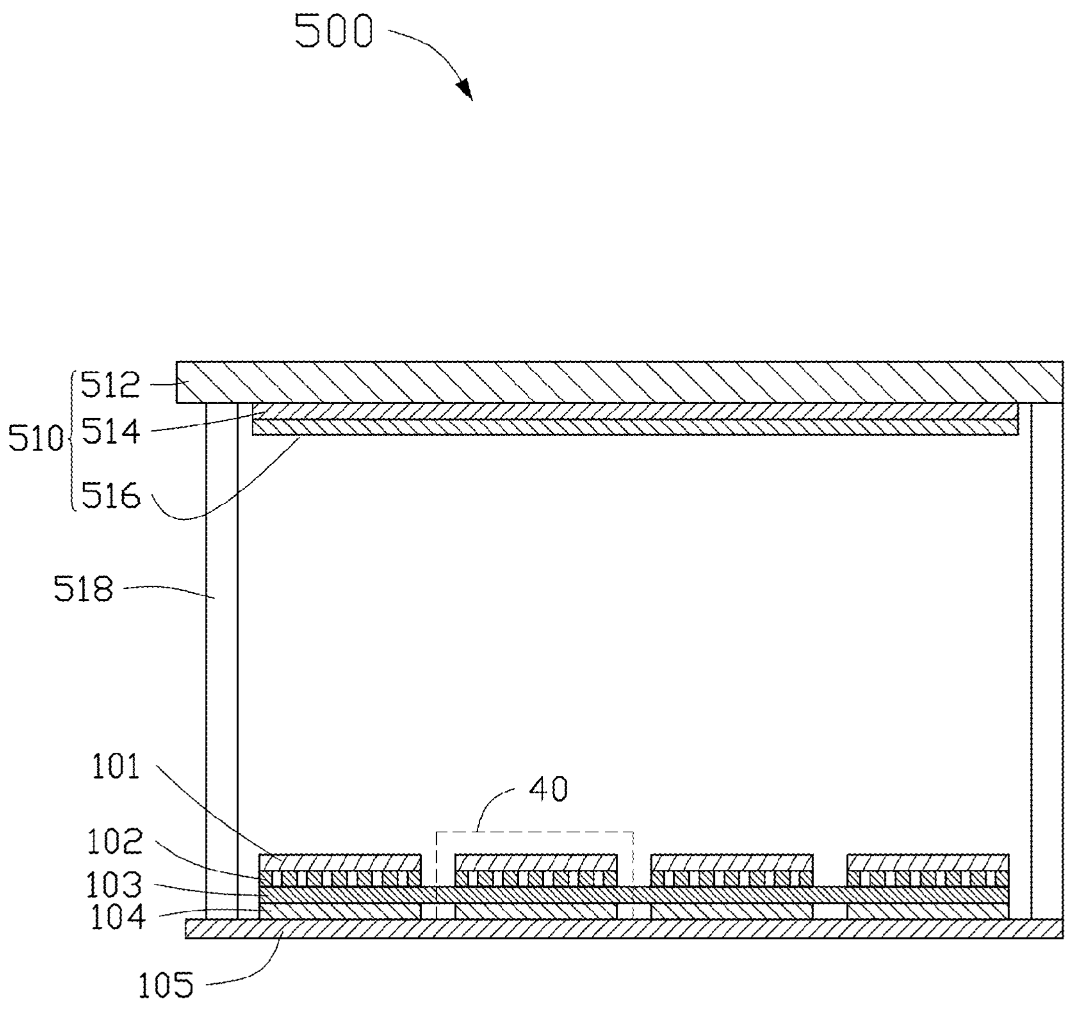
FIG. 11 shows a schematic view of one embodiment of an electron emission display.
Figure 12:
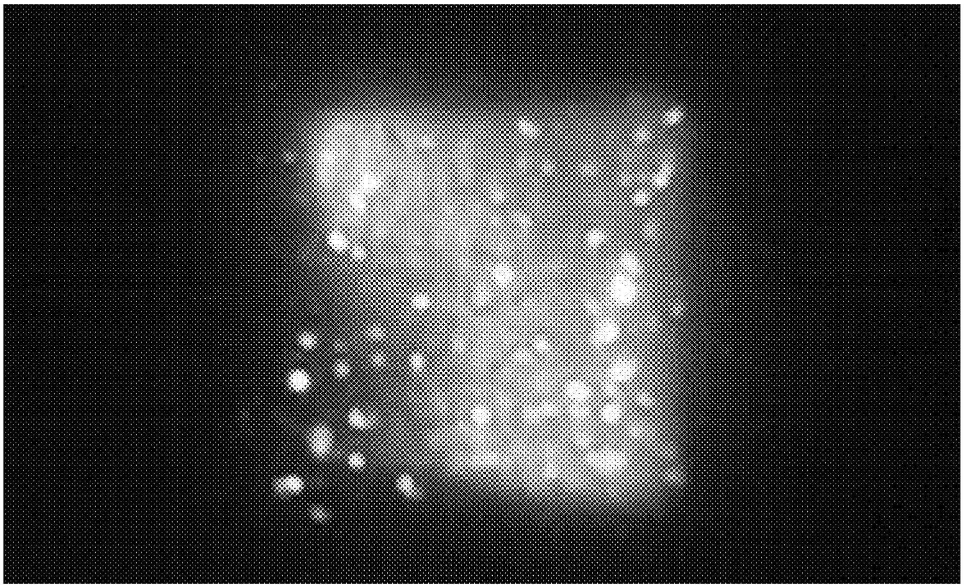
FIG. 12 shows an image of display effect of the electron emission display in FIG. 11.

Referring to FIGS. 11 and 12, an electron emission display 500 of one embodiment comprises a substrate 105, a plurality of electron emission units 40 on the substrate 105, and a anode structure 510. The plurality of electron emission units 40 are spaced from the anode structure 510 and face the anode structure 510.

The anode structure 510 comprises a glass substrate 512, an anode 514 on the glass substrate 512, and phosphor layer 516 coated on the anode 514. The anode structure 510 is supported by a insulating support 518, and sealed in the insulating support 518 and the glass substrate 512. The anode 514 can be indium tin oxide (ITO) film. The phosphor layer 516 faces the plurality of electron emission units 40.

In detail, the phosphor layer 516 faces each first electrode 101 in the plurality of electron emission units 40 to receive electrons emitted from the first electrode 101. In application, different voltages are applied to the first electrode 101, the second electrode 104, and the anode 514 of the electron emission display 500. In one embodiment, the second electrode 104 is at the ground or zero voltage, the voltage applied on the first electrode 101 is greater than 10 volts, and the voltage applied on the anode 514 is greater than 100 volts. The electrons emitted from the first electrode 101 of the electron emission unit 40 move toward the phosphor layer 516 driven under the electric filed. The electrons eventually reaches the anode structure 510 and bombarded the phosphor layer 516 coated on the anode 514. Thus fluorescence can be activated from the phosphor layer 516.

Figure 13:
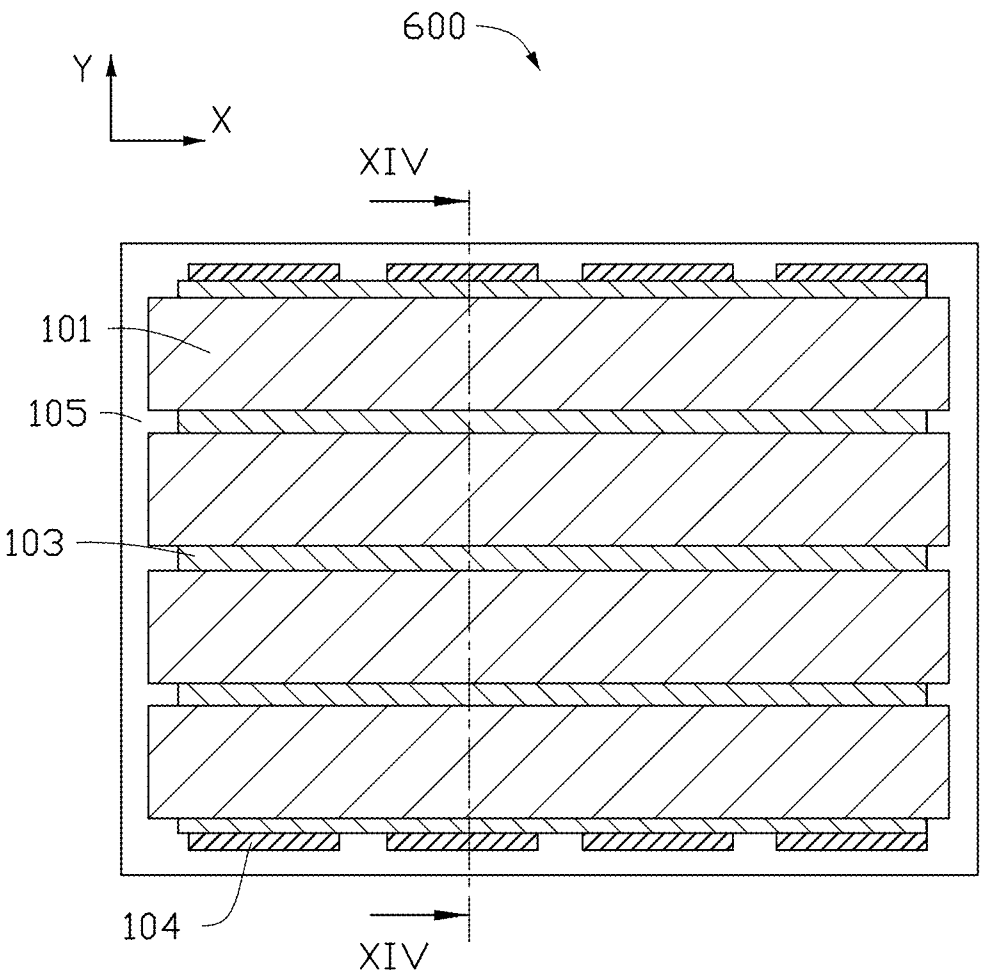
FIG. 13 shows a schematic view of another embodiment of an electron emission device.
Figure 14:
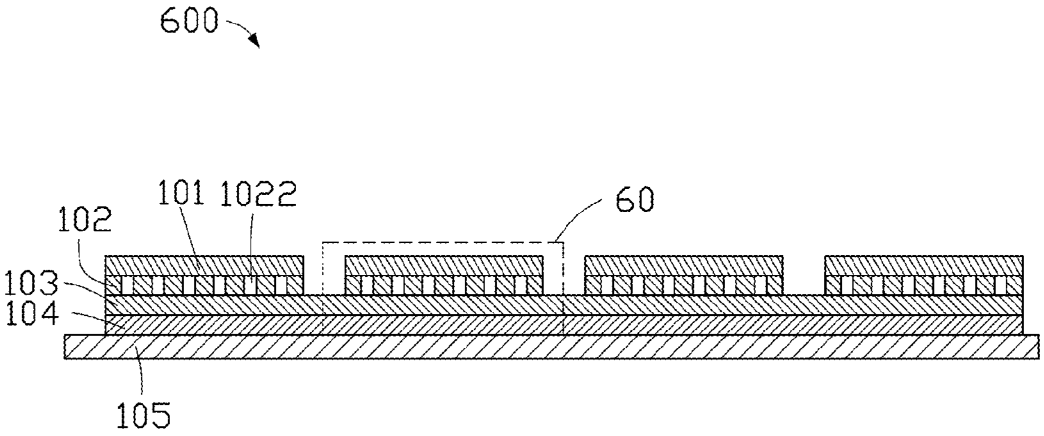
FIG. 14 shows a cross-section view of the electron emission device along a line XIV-XIV in FIG. 13.

Referring to FIGS. 13 and 14, an electron emission device 600 of one embodiment comprises a plurality of first electrodes 101 spaced from each other, a plurality of second electrodes 104 spaced from each other. The plurality of first electrodes 101 are bar-shaped and extend along a first direction, and the plurality of second electrodes 104 are bar-shaped and extend along a second direction that intersects with the first direction. The plurality of first electrodes 101 are intersected with the plurality of second electrodes 104. A semiconductor layer 102 and an insulating layer 103 are stacked together and sandwiched between the first electrode 101 and the second electrode 104 at intersections of the first electrode 101 and the second electrode 104. The first electrode 101 is located on the semiconductor layer 102.

The electron emission device 600 is similar to the electron emission device 400, except that the electron emission device 600 comprises the plurality of bar-shaped first electrodes 101 and the plurality of bar-shaped second electrodes 104.

The first direction can be defined as the X direction, and the second direction can be defined as the Y direction that intersects with the X direction. The Z direction is defined as a third direction perpendicular to the X direction and Y direction. The plurality of first electrodes 101 are aligned along a plurality of rows, and the plurality of second electrodes 104 are aligned along a plurality of columns. Thus the plurality of first electrodes 101 and the plurality of second electrodes 104 are overlapped with each other at the plurality of intersections. The electron emission device 600 at each intersection forms an electron emission unit 60. The electron emission unit 60 comprises the semiconductor layer 102 and the insulating layer 103 sandwiched between the first electrode 101 and the second electrode 104 at the intersection, and the semiconductor layer 102 is in contact with the first electrode 101.

The plurality of electron emission units 60 are spaced from each other and aligned along a plurality of rows and a plurality of columns. The semiconductor layers 102 in the plurality of electron emission units 60 are also spaced apart from each other. The plurality of semiconductor layers 102 aligned along the same row are electrically connected to the same first electrode 101. The plurality of semiconductor layers 102 aligned along the same column are electrically connected to the same second electrode 104. Thus the plurality of electron emission units 60 aligned along the same rows share the same first electrode 101, and the plurality of electron emission units 60 aligned along the same columns share the same second electrode 104.

While a voltage is applied between the first electrode 101 and the second electrode 104, the electrons can be emitted from each of the plurality of electron emission units 60 at the intersections. The plurality of electron emission units 60 share the same insulating layer 103. Furthermore, the insulating layer 103 in the plurality of electron emission units 60 can also be spaced apart from each other.

In application, the voltage is applied between the first electrode 101 and the second electrode 104, and the second electrode 104 can be applied with a ground or zero voltage, the voltage applied on the first electrode 101 can range from about 10 volts to about hundreds of volts such as 900 volts. An electric field is formed between the first electrode 101 and the second electrode 104 at the intersection. The electrons pass through the semiconductor layer 102 and emit from the first electrode 101.

Furthermore, the semiconductor layer 102 in the plurality of electron emission units 60 are connected to each other. Thus the plurality of electron emission units 60 share one continuous semiconductor layer 102.

Furthermore, the plurality of electron emission units 60 can also be similar to the plurality of electron emission units 20 as shown in FIG. 7, thus an electron collection layer 106 can be further sandwiched between the semiconductor layer 102 and the insulating layer 103 to improve the electron emitting efficiency.

Figure 15:
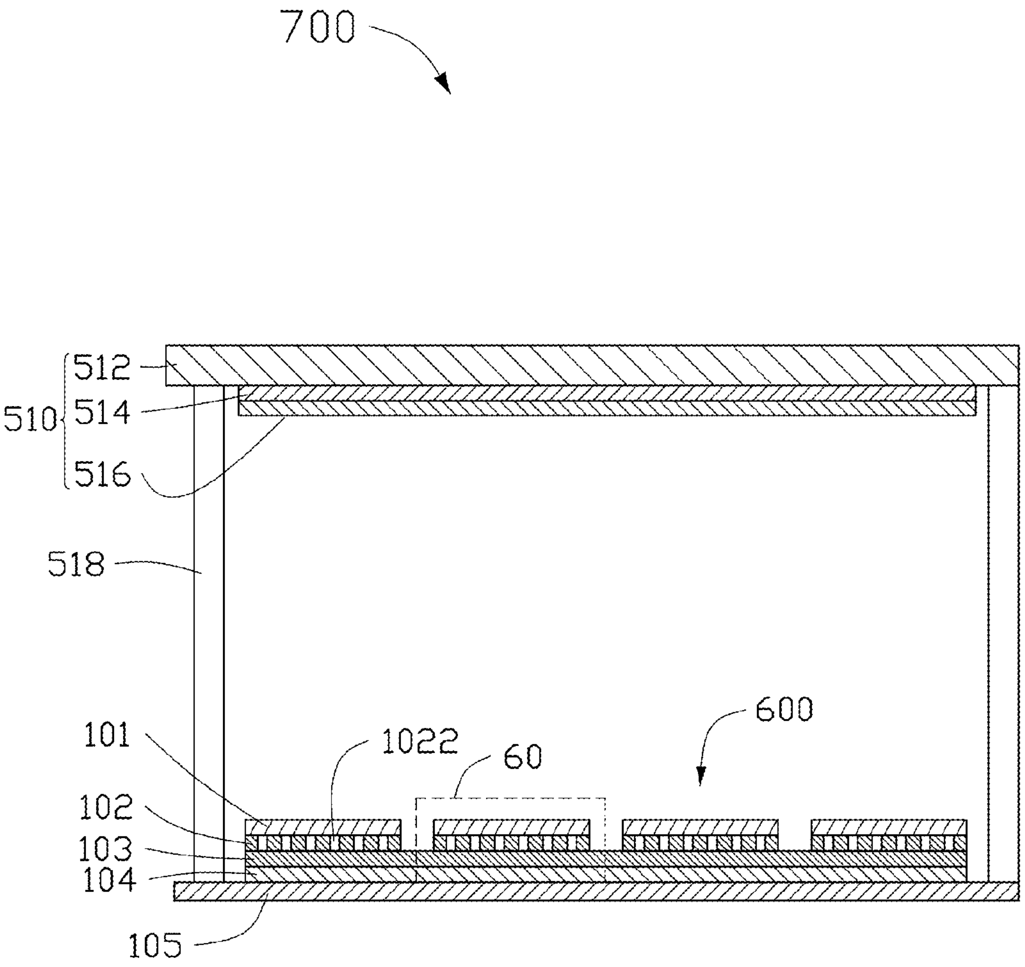
FIG. 15 shows a schematic view of another embodiment of an electron emission display.

Referring to FIG. 15, an electron emission display 700 of one embodiment comprises a substrate 105, an electron emission device 600 located on the substrate 105, and an anode structure 510 spaced from the electron emission device 600. The electron emission device 600 comprises a plurality of electron emission units 60.

The electron emission display 700 is similar to the electron emission display 500, except that in each of the plurality of electron emission units 60, the plurality of electron emission units 60 aligned along the same row share the same first electrode 101, and the plurality of electron emission units 60 aligned along the same column share the same second electrode 104.

The electrons emitted from the surface of the first electrode 101 at the intersection and bombard the phosphor layer 516 coated on the anode 514. Thus fluorescence is generated from the electron emission display 700.

Depending on the embodiment, certain of the steps of methods described may be removed, others may be added, and the sequence of steps may be altered. It is also to be understood that the description and the claims drawn to a method may include some indication in reference to certain steps. However, the indication used is only to be viewed for identification purposes and not as a suggestion as to an order for the steps.

It is to be understood that the above-described embodiments are intended to illustrate rather than limit the disclosure. Variations may be made to the embodiments without departing from the spirit of the disclosure as claimed. It is understood that any element of any one embodiment is considered to be disclosed to be incorporated with any other embodiment. The above-described embodiments illustrate the scope of the disclosure but do not restrict the scope of the disclosure.

What is claimed is:

1. An electron emission device, the electron emission device comprising:

a plurality of electron emission units spaced from each other, wherein each of the plurality of electron emission units comprises:

a first electrode, wherein the first electrode comprises a carbon nanotube layer;

a semiconductor layer located on the first electrode and electrically connected to the first electrode, wherein the semiconductor layer defines a plurality of holes, and a portion of the carbon nanotube layer corresponding to the plurality of holes is suspended on the plurality of holes;

an insulating layer located on a surface of the semiconductor layer away from the first electrode; and a second electrode located on the insulating layer away from the semiconductor layer.

2. The electron emission device of claim 1, wherein the semiconductor layer is a continuous structure in each of the plurality of electron emission units.

3. The electron emission device of claim 1, wherein the plurality of holes are blind holes distributed on a surface of the semiconductor layer adjacent to the carbon nanotube layer.

4. The electron emission device of claim 1, wherein the plurality of holes are through holes along a thickness direction of the semiconductor layer.

5. The electron emission device of claim 1, wherein a diameter of each of the plurality of holes ranges from about 5 nanometers to about 50 nanometers.

6. The electron emission device of claim 1, wherein the semiconductor layer is divided into a plurality of blocks spaced from each other.

7. The electron emission device of claim 1, wherein the carbon nanotube layer comprises a plurality of carbon nanotubes extending parallel with a surface of the semiconductor layer.

8. The electron emission device of claim 1, wherein each insulating layer in the plurality of electron emission units are connected to each other to form a single layer structure.

9. The electron emission device of claim 1, wherein the plurality of electron emission units are aligned to form an array having a plurality of rows and columns.

10. The electron emission device of claim 9, further comprising a plurality of row electrodes and a plurality of column electrodes electrically connected to the plurality electron emission units, and the plurality of row electrodes are intersected with the plurality of column electrodes to form a grid, and a section is defined between each two adjacent row electrodes and two adjacent column electrodes, one of the plurality of electron emission units is received in the section.

11. The electron emission device of claim 1, wherein the carbon nanotube layer consists of a plurality of carbon nanotubes.

12. The electron emission device of claim 11, wherein the plurality of carbon nanotubes are joined end to end by van der Waals force to form a free-standing structure.

13. The electron emission device of claim 1, wherein the carbon nanotube layer comprises a carbon nanotube film, a carbon nanotube wire, or a combination thereof.

14. The electron emission device of claim 1, wherein the carbon nanotube layer comprises a plurality of carbon nanotube films stacked together.

15. The electron emission device of claim 1, wherein the carbon nanotube layer comprises a plurality of carbon nanotube wires parallel with each other or intersected with each other.

16. The electron emission device of claim 1, further comprising an electron collection layer sandwiched between the semiconductor layer and the insulating layer in each of the plurality of electron emission units.

17. The electron emission device of claim 16, wherein the electron collection layer comprises a graphene layer.

18. The electron emission device of claim 16, wherein the electron collection layer comprises a plurality of carbon nanotubes connected with each other to form a conductive network.

19. An electron emission display, comprising:

a substrate;

an electron emission device on the substrate, wherein the electron emission device comprises:

a plurality of electron emission units, wherein each of the plurality of electron emission units comprises a first electrode, a semiconductor layer, an insulating layer, and a second electrode stacked together, wherein the first electrode comprises a carbon nanotube layer, the semiconductor layer defines a plurality of holes, the carbon nanotube layer covers the plurality of holes, and a portion of the carbon nanotube layer is suspended on the plurality of holes;

an anode structure spaced from electron emission device, wherein the anode structure comprises an anode and a phosphor layer coated on the anode, and the phosphor layer faces to the electron emission device.

* * * * *